United States Patent
Oh et al.

(10) Patent No.: US 7,265,039 B2
(45) Date of Patent: Sep. 4, 2007

(54) METHOD FOR FABRICATING SEMICONDUCTOR DEVICE WITH IMPROVED REFRESH TIME

(75) Inventors: Jae-Geun Oh, Kyoungki-do (KR); Byung-Seop Hong, Kyoungki-do (KR)

(73) Assignee: Hynix Semiconductor, Inc., Ichon-Si (KR)

( * ) Notice: Subject to any disclaimer, the term of this patent is extended or adjusted under 35 U.S.C. 154(b) by 0 days.

(21) Appl. No.: 10/750,318

(22) Filed: Dec. 30, 2003

(65) Prior Publication Data

US 2004/0266156 A1 Dec. 30, 2004

(30) Foreign Application Priority Data

Jun. 30, 2003 (KR) ........................ 10-2003-0043081

(51) Int. Cl.
*H01L 21/425* (2006.01)
(52) U.S. Cl. ................ 438/527; 438/533; 438/923; 257/21.158
(58) Field of Classification Search ............. 438/527, 438/533, 923; 257/E21.158
See application file for complete search history.

(56) References Cited

U.S. PATENT DOCUMENTS

| | | | | |
|---|---|---|---|---|
| 5,594,264 | A * | 1/1997 | Shirahata et al. ........... | 257/335 |
| 6,087,253 | A * | 7/2000 | Liaw .......................... | 438/648 |
| 6,410,951 | B2  | 6/2002 | Fischer et al. | |
| 6,482,707 | B1 * | 11/2002 | Fischer et al. .............. | 438/303 |
| 6,693,014 | B2 * | 2/2004 | Fischer et al. .............. | 438/303 |
| 6,743,692 | B2 * | 6/2004 | Shiratake et al. .......... | 438/381 |
| 6,759,288 | B2 * | 7/2004 | Tran et al. .................. | 438/194 |
| 6,767,780 | B2 * | 7/2004 | Sohn et al. ................. | 438/217 |
| 6,806,133 | B2 * | 10/2004 | Oh .............................. | 438/223 |

FOREIGN PATENT DOCUMENTS

KR    1999-018635    3/1999

OTHER PUBLICATIONS

Beyer, William H., ed., *CRC Standard Mathematical Tables and Formulae*, CRC Press (1991), p. 331.*
Mayer et al., *Electronic Materials Science: For Integrated Circuits in Si and GaAs*, Macmillan (1990), p. 227-232.*
Wolf, *Silicon Processing for the VLSI Era: Process Technology*, Lattice Press (1986), p. 323-325.*

* cited by examiner

*Primary Examiner*—Bradley K. Smith
(74) *Attorney, Agent, or Firm*—Townsend and Townsend and Crew LLP

(57) ABSTRACT

The present invention relates to a method for fabricating a semiconductor device with improved refresh time. The method includes the steps of: forming a plurality of gate lines on a substrate; forming a plurality of cell junctions by ion-implanting a first dopant with use of the gate lines as a mask; forming a buffer layer along a gate line profile; and forming a plurality of plug ion-implantation regions in the cell junctions by ion-implanting a second dopant into the substrate under the presence of the buffer layer to thereby from the plugs thereon.

14 Claims, 6 Drawing Sheets

METHOD FOR FABRICATING SEMICONDUCTOR DEVICE WITH IMPROVED REFRESH TIME

FIELD OF THE INVENTION

The present invention relates to a method for fabricating a semiconductor device; and, more particularly, to a method for fabricating a semiconductor device with improved refresh time.

DESCRIPTION OF RELATED ARTS

In a cell region of a dynamic random access memory (DRAM) device, a contact plug for connecting a cell junction formed in a substrate to a bit line or a storage node of a capacitor, i.e., a cell contact plug, is usually made of polysilicon. The polysilicon cell contact plug is doped with a dopant with a concentration of above about $1 \times 10^{20}/cm^3$ to increase conductivity. Meanwhile, the cell of the DRAM device is confronted with different types of resistances, e.g., a channel resistance, a resistance exerted by a cell junction itself, a contact resistance of the cell junction. For a channel or a cell junction, ion-implantation energy or dose of the dopant are controlled to decrease the above mentioned resistances existing in the cell.

Particularly, since the resistance exerted by the cell junction itself is not prominently high, only a doping concentration of a dopant implanted into the polysilicon layer is controlled in order to reduce the resistance. Thus, an importance of the contact resistance is increasingly emphasized as the size of the cell contact plug gets smaller.

However, it is limited to decrease the contact resistance at the cell junction and an interfacial area contacting to a storage node by controlling only the doping concentration of the polysilicon layer. To solve this problem, a cell plug ion-implantation technique is employed. The cell plug ion-implantation technique provides an effect of decreasing the contact resistance between the cell junction and the cell contact plug by additionally ion-implanting dopants to the cell junction after a contact hole is formed.

FIGS. 1A to 1C are cross-sectional views showing a semiconductor device fabricated by employing a conventional cell plug ion-implantation technique.

Referring to FIG. 1A, a p-type well 11A for a transistor region is formed in a substrate defined as a cell region. Then, field oxide layers 12 are formed through a shallow trench isolation (STI) technique. On the substrate 11, a gate insulation layer 13, a first gate conductive layer 14, a second gate conductive layer 15 and a mask oxide layer 16 are sequentially stacked.

Next, a plurality of cell junctions 17 are formed between gate lines by ion-implanting a low concentration of a dopant with use of the gate lines as a mask. As well-known, the cell junctions 17 are formed only through an ion-implantation of a low concentration of a dopant to suppress generations of leakage currents, and this region ion-implanted with the low concentration of the dopant is called a lightly doped drain (DDL) region. On the other hand, an n-channel metal-oxide field-effect transistor (nMOSFET) formed in a peripheral circuit region adopts a source/drain structure of a LDD region formed by ion-implantations with a low concentration of a dopant and a high concentration of a dopant. Also, a p-channel MOSFET (pMOSFET) adopts a structure suppressing a short channel effect (SCE) by performing a pocket ion-implantation around a source/drain structure.

Referring to FIG. 1B, a spacer 18 is formed at both sidewalls of each gate line, and then, an inter-layer insulation layer 19 is deposited on a substrate structure including the gate lines. The inter-layer insulation layer 19 is etched by using a landing plug contact (LPC) mask (not shown) as an etch mask so to form contact holes for forming cell contact plugs. At this time, a surface of each cell junction 17 is exposed.

Afterwards, plug ion-implantation regions 20 having a similar projected range (Rp) to that of the cell junction 17 are formed by performing a cell plug ion-implantation technique for decreasing a contact resistance between the cell junction 17 and the cell contact plug. Herein, the cell plug ion-implantation is for enhancing a driving power of a transistor formed in the cell region by decreasing the contact resistance between the cell junction 17 and the cell contact plug. Also, the cell plug ion-implantation is proceeded after the formation of the contact holes for forming the cell contact plugs.

Referring to FIG. 1C, a polysilicon layer is deposited on an entire surface of the resulting structure and is subjected to an etch-back process or a chemical mechanical polishing (CMP) process to form cell contact plugs 21 contacting to the corresponding cell junctions 17.

As shown in the above, the cell plug ion-implantation technique is used to increase saturation currents of the cell transistor by decreasing the cell contact resistance.

Despite of this advantage of increasing the saturation currents, it is still limited to increase reliability of a device, i.e., the refresh time. In other words, since the plug ion-implantation region 20 is directly contacted to the cell junction 17, the junction concentration increases abruptly, and this abrupt increase further results in a sharp increase of a slope of the concentration with respect to a depth. Therefore, a width of a depletion layer between the p-type well 11A and the cell junctions 17 is decreased, and this result further induces an increase in an electric field to thereby decrease refresh time.

SUMMARY OF THE INVENTION

It is, therefore, an object of the present invention to provide a method for fabricating a semiconductor device capable of preventing degradation of a refresh time by giving a consistent ion-implantation concentration with respect to a depth in a plug ion-implantation region for improving a contact resistance between a cell junction and a cell contact plug.

In accordance with an aspect of the present invention, there is provided a method for forming plugs on active regions of a semiconductor device, including the steps of: forming a plurality of gate lines on a substrate; forming a plurality of cell junctions by ion-implanting a first dopant with use of the gate lines as a mask; forming a buffer layer along a gate line profile; and forming a plurality of plug ion-implantation regions in the cell junctions by ion-implanting a second dopant into the substrate under the presence of the buffer layer to thereby from the plugs thereon.

In accordance with another aspect of the present invention, there is provided a method for fabricating a semiconductor device, including the steps of: forming a plurality of gate lines on a substrate; forming a plurality of cell junctions by ion-implanting a first dopant with use of the gate lines as a mask; forming a buffer layer along a gate line profile; and forming a plurality of plug ion-implantation regions in the cell junctions by ion-implanting a second dopant into the substrate under the presence of the buffer layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

With reference to the accompanying drawings, detailed descriptions on a semiconductor device with improved refresh time and a method for fabricating the same will be provided in the following.

FIGS. 2A to 2D are cross-sectional views of a semiconductor device fabricated in accordance with a preferred embodiment of the present invention.

Figure 1A:
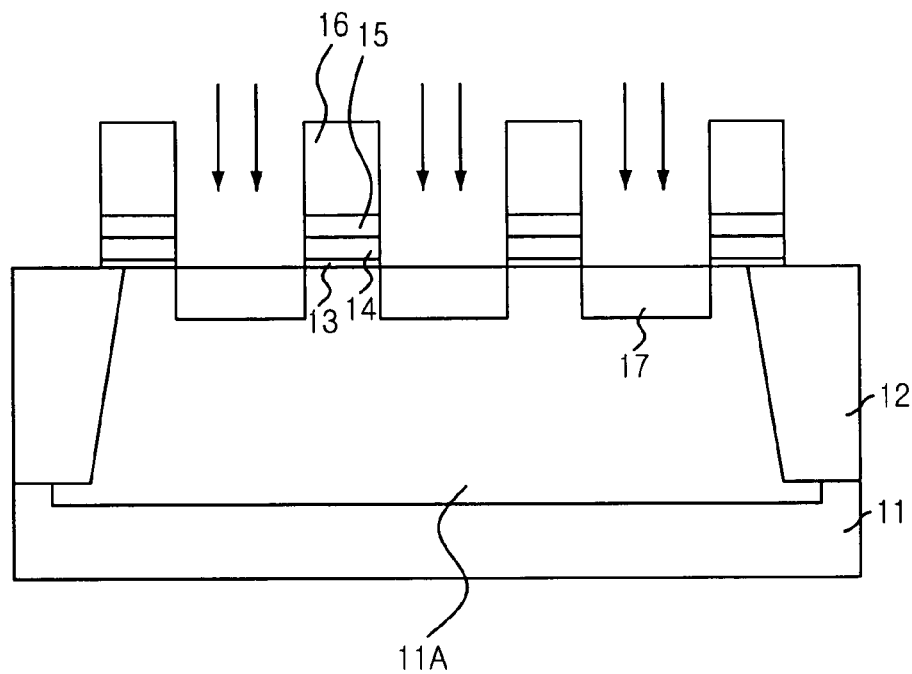
FIGS. 1A to 1C are cross-sectional views showing a semiconductor device fabricated by a conventional cell plug ion-implantation technique.
Figure 1B:
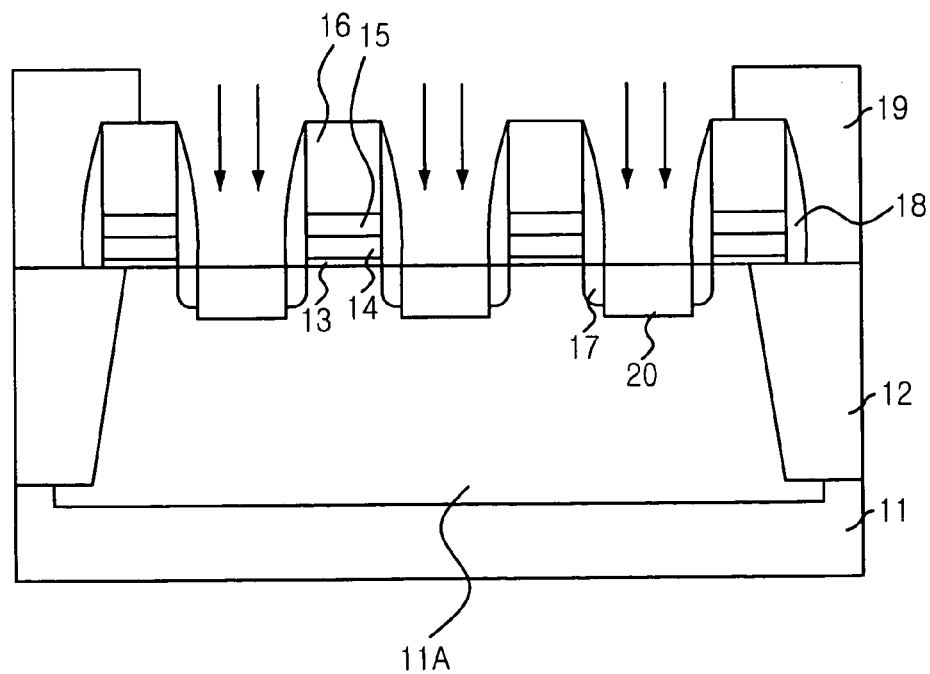
Figure 1C:
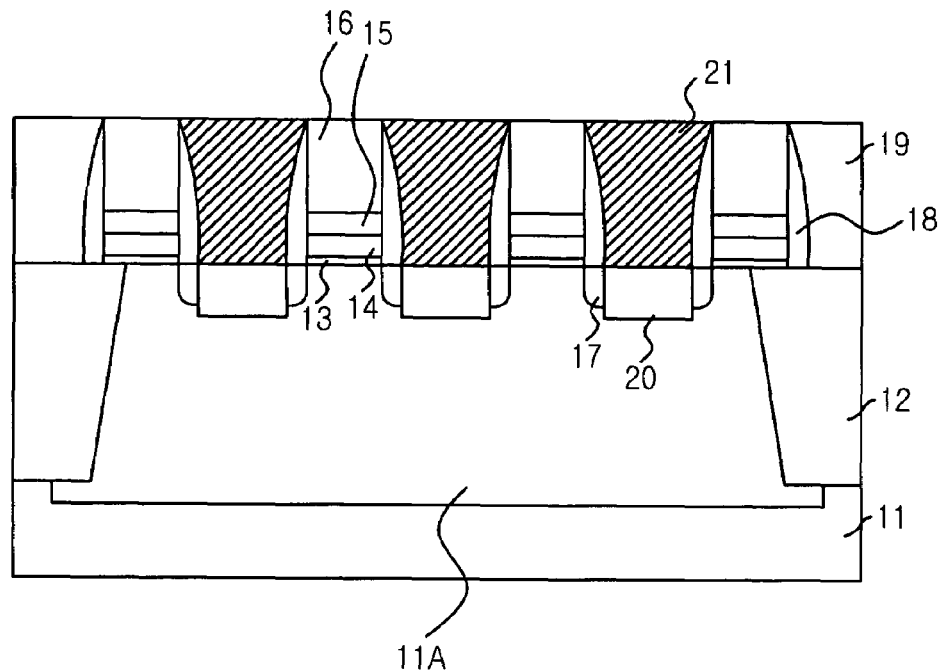
Figure 2A:
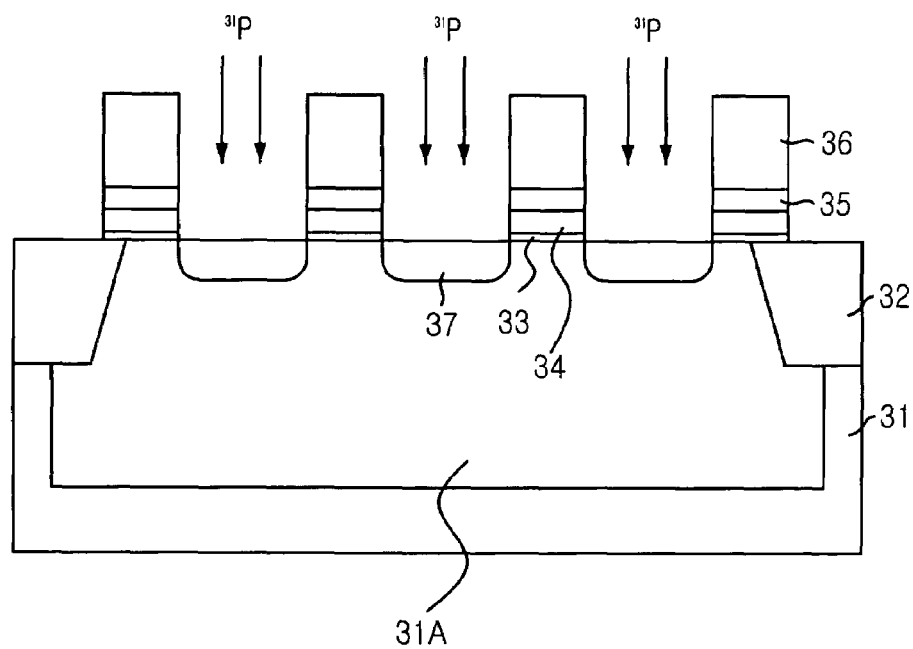
FIGS. 2A to 2D are cross-sectional views showing a semiconductor device fabricated in accordance with a preferred embodiment of the present invention.

Referring to FIG. 2A, a p-type well 31A is formed in a substrate 31 providing a transistor in a cell region by ion-implanting a p-type dopant. At this time, a dose of boron used in the ion-implantation for forming the p-type well 31A ranges from about $5 \times 10^{12}$ ions/cm$^2$ to about $3 \times 10^{13}$ ions/cm$^2$. Also, energy of about 180 keV to about 300 keV is used in the above ion-implantation process.

Next, field-oxide layers 32 are formed through a shallow trench isolation (STI) technique. Then, a plurality of gate lines are formed. Herein, each gate line is formed by sequentially stacking a gate insulation layer 33, a first gate conductive layer 34, a second gate conductive layer 35 and a mask oxide layer 36 on the substrate 31. Herein, the gate insulation layer 33 is a typical silicon oxide (SiO$_2$) based layer, and the first gate conductive layer 34 is a polysilicon layer. The second gate conductive layer 35 is a metal layer having a low resistance. Examples of the metal layer are a tungsten (W) layer and a tungsten silicide layer (WSi$_2$).

A plurality of cell junctions 37 are formed in the substrate 31 disposed between the gate lines through an ion-implantation of a dopant by using the gate lines as a mask. At this time, the cell junctions 37 are formed by ion-implanting an N-type dopant such like phosphorus (P) with a low concentration. The reason for using the low concentration of the N-type dopant is to form a lowly concentrated source/drain in a cell region for suppressing generations of leakage currents and to form a source/drain with lightly doped drain (LDD) structure in a peripheral circuit region. Herein, the cell junctions 37 are formed by ion-implanting phosphorus (P) or arsenic (As) of which dose ranges from about $1 \times 10^{13}$ ions/cm$^2$ to about $5 \times 10^{13}$ ions/cm$^2$ with low energy of about 70 keV to about 80 keV. In addition, the ion-implantation can be proceeded with a tilt angle of about 0° to about 20°. In case that the tilt angle is above 5°, wafers are rotated two or four times.

Figure 2B:
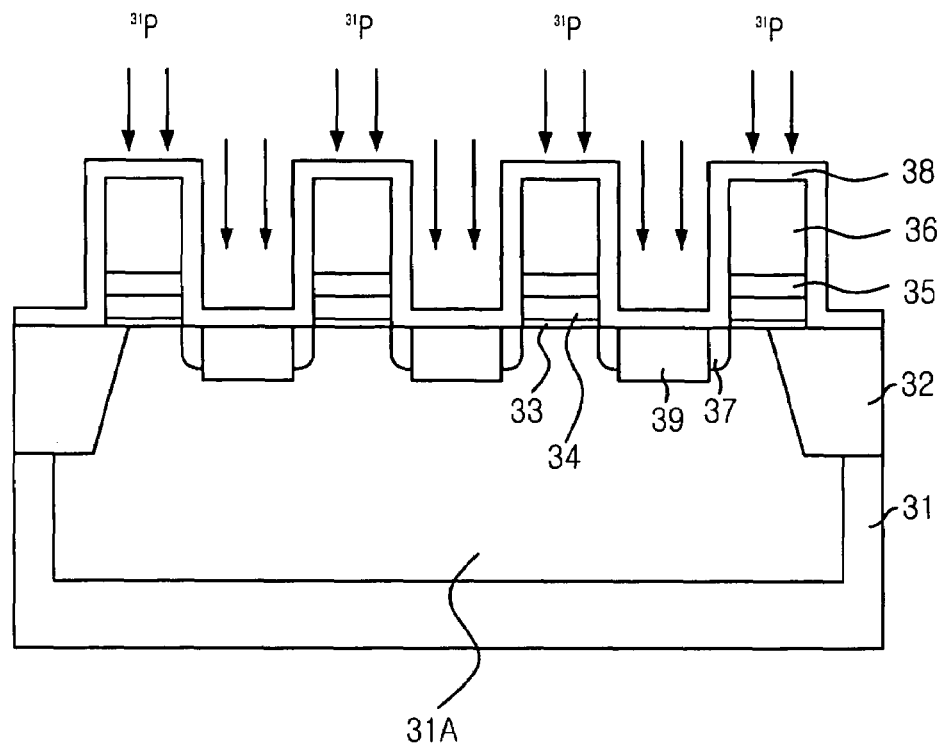

Referring to FIG. 2B, a buffer layer 38 is deposited on an entire surface of the resulting structure including the gate lines. At this time, the buffer layer 38 is formed with a nitride layer having a thickness in a range from about 200 Å to about 500 Å. After the formation of the buffer layer 38, a blanket ion-implantation is performed to form a plurality of plug ion-implantation regions 39. Herein, the blanket ion-implantation is an implantation process performed to an entire surface of the above constructed structure without using an ion-implantation mask.

In more detail of the plug ion-implantation regions 39, higher energy is used since a projected range (Rp) of the plug ion-implantation region 39 should be similar to that of the cell junction 37. That is, unlike the typical ion-implantation technique proceeding under the absence of the buffer layer 38, the energy should be increased to meet the required Rp level because of the buffer layer 38 having a predetermined thickness. Also, the ion-implantation should be applied with a higher dose of a dopant compared to the typically applied dose to complement losses of the dopant caused by the buffer layer 38.

For the blanket ion-implantation, the same N-type dopant doped into the cell junctions 37 is used. At this time, $^{31}$P is used as the N-type dopant. Also, the implantation energy and dose of $^{31}$P are in a range of about 80 keV to about 150 keV and in a range from about $1 \times 10^{12}$ ions/cm$^2$ to about $3 \times 10^{13}$ ions/cm$^2$. Meanwhile, the implantation energy gets lower as the buffer layer 38 gets thinner. On the other hand, the implantation energy gets higher as the buffer layer 38 gets thicker. Also, the dose of the $^{31}$P is controlled under a consideration on losses of the $^{31}$P while passing through the buffer layer 38.

Meanwhile, the blanket ion-implantation can be performed with distributed energy applied into two or three steps to obtain a less inclined slope of a concentration with respect to a depth. For instance, the implantation energy within a range from about 80 keV to about 150 keV is applied in several steps by being gradually increased from a low implantation energy to a high implantation energy. For instance, the implantation energy of about 80 keV is applied first, and is gradually increased to about 100 keV in a second application. Lastly, the implantation energy of about 120 keV is applied. At this time, it is also possible to apply the dose of the dopant in several steps as like the implantation energy.

If the plug ion-implantation regions 39 are formed through the above-described blanket ion-implantation technique, a concentration profile of the implanted dopant can be broadened. That is, low implantation energy of about 40 keV to about 70 keV is used to meet the required Rp in case that the ion-implantation is carried out without the buffer layer 38. Thus, a slope of a dopant concentration with respect to a depth is very inclined and narrow. However, when the ion-implantation is carried out under the presence of the buffer layer 38, the implantation energy of about 80 keV to about 150 keV is applied so that the slope of the dopant concentration with respect to the depth is less inclined, i.e., rounded and broadened. More detailed descriptions on this fact will be provided in FIG. 3.

Figure 2C:
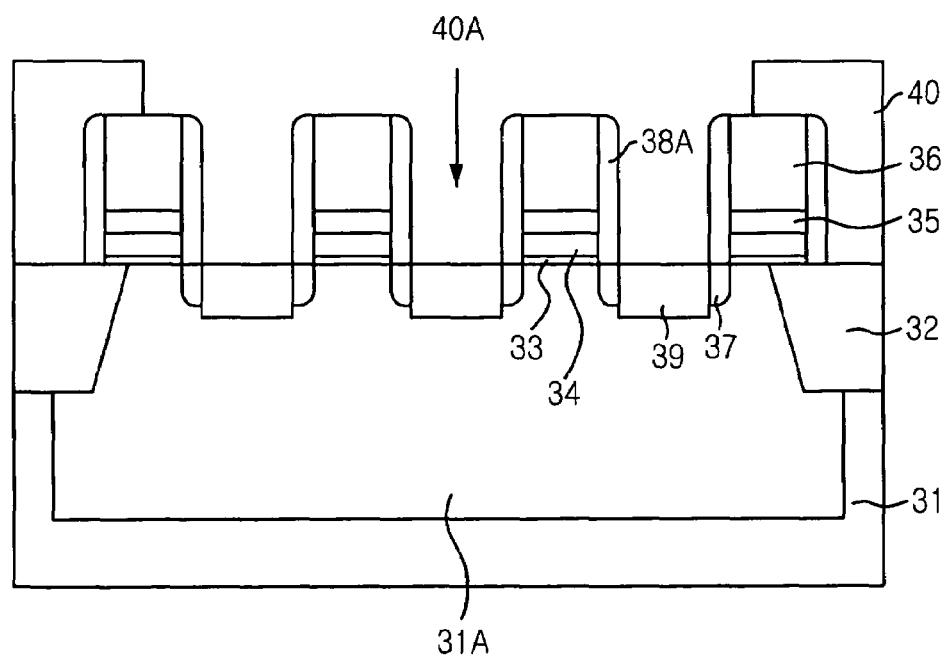

Referring to FIG. 2C, a gate spacer 38A contacting to both sidewalls of each gate line is formed by performing an etch-back process to the buffer layer 38. Then, an inter-layer insulation layer 40 is deposited on an entire surface of the above resulting structure including the gate spacer 38A and the gate lines.

Next, a landing plug contact (LPC) mask (not shown) is formed on the inter-layer insulation layer 40. The inter-layer insulation layer 40 is then etched with use of the LPC mask as an etch mask to form a plurality of contact holes 40A exposing a surface of each cell junction 37. At this time, the gate spacer 38A functions as an etch barrier layer while the inter-layer insulation layer 40 is etched so as to prevent the gate lines from being attacked during the above etching process.

Figure 2D:
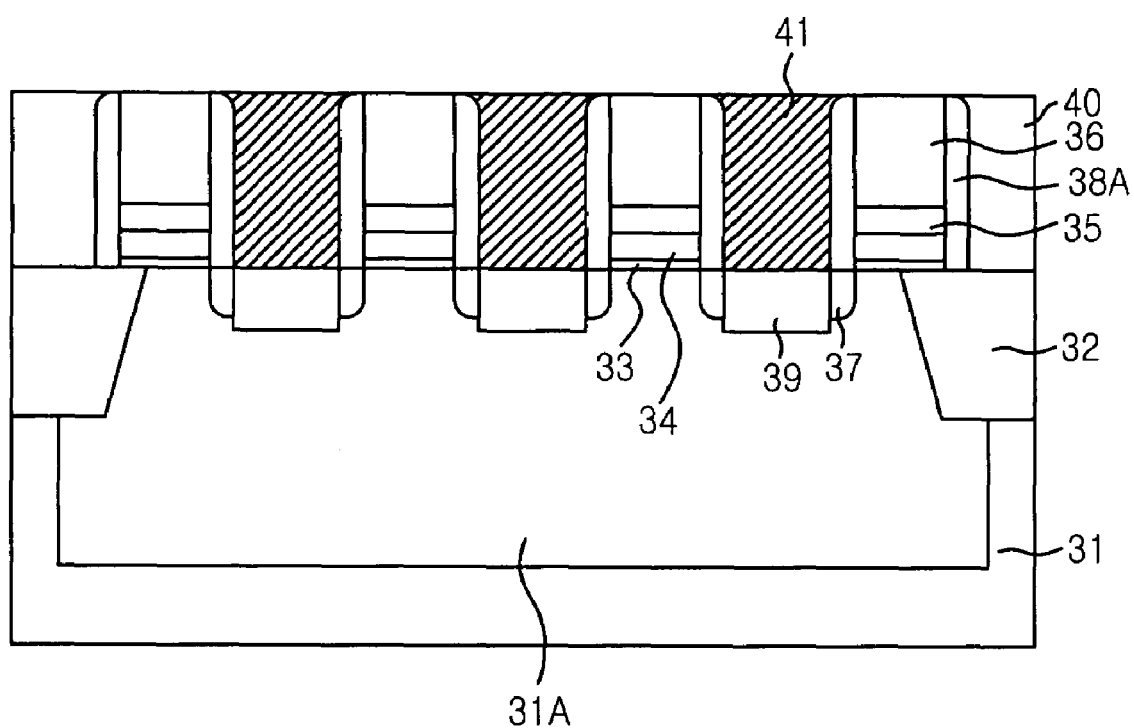

Referring to FIG. 2D, a polysilicon layer is deposited on an entire surface of the above resulting structure including the contact holes 40A. Then, a chemical mechanical polishing (CMP) process is performed until a surface of the mask oxide layer 36 is exposed so that a plurality of cell contact plugs 41 contacted to the cell junctions 37 are formed.

Figure 3:
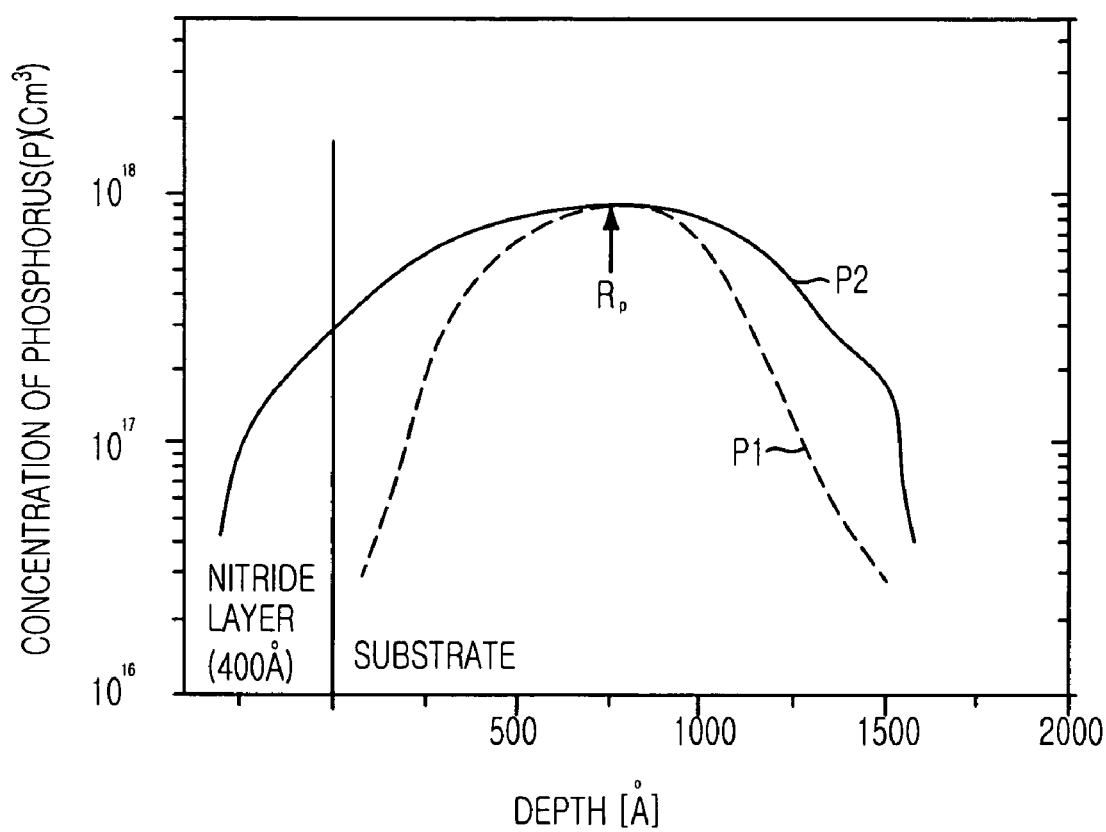
FIG. 3 is a comparative graph showing slopes of a concentration of a plug ion-implantation region with respect to a depth according to the conventional method and the present invention.

FIG. 3 is a comparative graph showing slopes of a concentration of a plug ion-implantation region with respect to a depth according to the conventional method and the present invention. Herein, a horizontal axis represents a depth expressed in the unit of Å, while a vertical axis represents a concentration of phosphorus (P) expressed in the unit of ions/cm$^3$. In FIG. 3, the curve P1 is a case of doping $^{31}$P with a dose of about 5×10$^{12}$ ions/cm$^2$ along with applied energy of about 55 keV. The curve P2 is a case of doping $^{31}$P with a dose of about 9×10$^{12}$ ions/cm$^2$ along with applied energy of about 100 keV under a state that a nitride layer is formed in a thickness of about 400 Å.

As shown, the two curves P1 and P2 have different shapes even though a Rp of the curve P1 has the same Rp of the curve P2 expressing a case that implantation energy and dose are increased more than those in the curve P1. Particularly, the Rps of the curves P1 and P2 are the same around a depth of about 750 Å. For instance, the curve P1 obtained after doping $^{31}$P into a substrate with low implantation energy under the absence of a nitride layer is more sharply and narrowly sloped. In contrary to the curve P1, the curve P2 obtained after doping $^{31}$P into a substrate with high implantation energy under the presence of the nitride layer formed is rounded and broadened.

Thus, despite of the same Rp values, the curves P1 and P2 have the different shapes due to the nitride layer having the thickness of about 400 Å causing high implantation energy and dose to be used in order to meet the required Rp identical to the Rp of the curve P1. As mentioned above, the curve P1 has the same level of Rp even with the use of low implantation energy. Generally, it is known that a difference $\Delta$Rp between Rp values gets larger in case that the Rp value of a sample to which high implantation energy is applied is identical to that of a sample to which low implantation energy is applied. Herein, the $\Delta$Rp is a value of about 60% of the original Rp and a reference value for determining a degree of slope of the curve for concentration with respect to depth.

Eventually, the curve P2 obtained by using high implantation energy for obtaining the same Rp value of the curve P1 has a rounded and broadened slope as the $\Delta$Rp increases. As a result, it is possible to suppress a width of a depletion layer between a p-type well and a cell junction from being decreased. This fact makes it further possible to mitigate an electric field concentrated at the cell junction.

Figure 4:
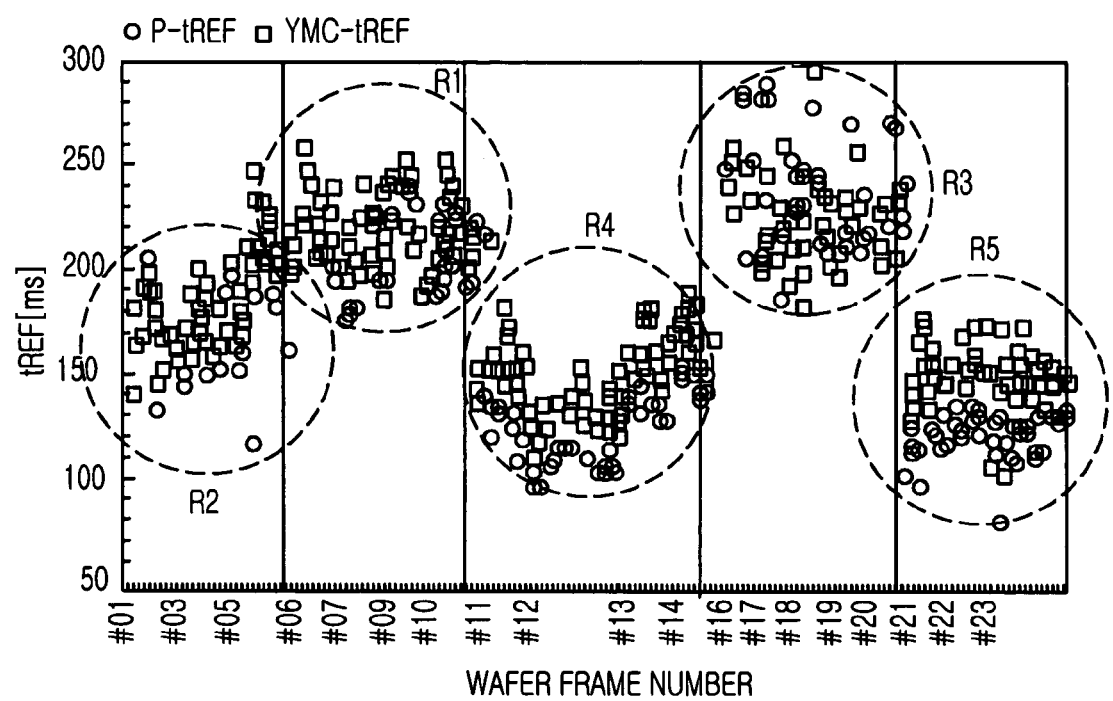
FIG. 4 is a comparative diagram showing refresh time taken by employing the conventional method and the present invention.

FIG. 4 is a comparative diagram showing refresh time taken by using the conventional method and the present invention. Herein, the horizontal axis represents wafer frame numbers, while the vertical axis represents refresh time ($_r$REF) expressed in the unit of ms. Also, the reference symbols 'o' and '□' represent a pause-refresh time (P-$_r$REF) and a Y-march refresh time (YMC-$_r$REF), respectively. Herein, the pause-refresh time P-$_r$REF expresses an interval of the refresh time, while the Y-march refresh time expresses measured refreshed time by the Y-march refresh method.

In addition, the denotation R1 is a case that both implantation energy and dose of the dopant are increased. The denotation R2 represents a case that the dose of the dopant is decreased compared to the case of R1. The denotation R3 is a case that implantation energy is increased compared to the case of R1. The denotations R4 and R5 show a resultant case of employing the conventional method that low implantation energy is applied under the absence of a nitride layer. Particularly, the denotation R5 shows a result of using the higher implantation energy than that used in the case of R4.

More specifically, the cases R4 and R5 express the result that the pause-refresh time P-$_r$REF and the Y-march refresh time YMC-$_r$REF are short in about 90 ms to about 150 ms. On the other hand, the cases R1, R2 and R3 wherein the plug ion-implantation technique is performed under the presence of the nitride layer has a long pause-refresh time P-$_r$REF and Y-march refresh time YMC-$_r$REF in about 130 ms to about 300 ms. As shown, it is observed that the refresh time illustrated in the cases R1, R2 and R3.

Although the preferred embodiment of the present invention is limited to the cell region, it is possible to attain an additional effect on suppression of a short channel effect (SCE) in a p-channel metal-oxide semiconductor field-effect transistor (pMOSFET) due to the deposition of the buffer layer in a peripheral circuit region. For instance, since the plug ion-implantation technique is performed without using the mask after the deposition of the buffer layer, ion-implantations are carried out in the nMOSFET and pMOSFET regions in the peripheral circuit region. Particularly, in the pMOSFET region, a counter doping occurs in a designated shallow p-type source/drain region so as to function as a typical pocket ion-implantation. That is, a pocket ion-implantation region is locally formed in a direction of a channel of the p-type source/drain region by ion-implanting a dopant having an opposite type to the dopant used in forming the p-type source/drain region. As a result, the SCE effect can be suppressed.

As known well, a single gate spacer is formed in the cell region, while a dual spacer is formed in the peripheral circuit region. Especially, for the dual spacer, a second spacer is formed after the formation of a first gate spacer, i.e., the etched buffer layer. Thereafter, the p-type source/drain region is formed. Consequently, it is possible to form locally a pocket ion-implantation region in a direction of a channel of the p-type source/drain region with the size as much as the width of the second gate spacer. Therefore, an additional ion-implantation process for forming the pocket ion-implantation region is not necessary.

Since the plug ion-implantation process for improving a contact resistance between the cell contact plug and the cell junction is performed by using high energy under the presence of the buffer layer, it is possible to obtain a rounded and broadened slope of concentration with respect to depth. Eventually, refresh time of a device will be increased.

While the present invention has been described with respect to certain preferred embodiments, it will be apparent to those skilled in the art that various changes and modifications may be made without departing from the scope of the invention as defined in the following claims.

What is claimed is:

1. A method for forming contact plugs on active regions of a semiconductor device, the method comprising:
    forming a plurality of gate lines on a substrate;
    implanting first dopants of a first conductivity type into the substrate using the gate lines as a mask to form a plurality of cell junctions, each gate line being provided between two cell junctions;

forming a buffer layer over the cell junctions, the buffer layer having a thickness of more than 200 Å;

implanting second dopants of the first conductivity type through the buffer layer and into the cells junctions using a first energy level to form a plurality of plug ion-implantation regions of a given depth, the plug ion-implantation regions being configured to receive the contact plugs;

implanting the second dopants of the first conductivity type through the buffer layer and into the cell junctions using a second energy level that is different from the first energy level to form the plug ion-implantation regions;

forming a well of a second conductivity type within the substrate, wherein the cell junctions and the plug ion-implantation regions are defined within the well; and forming a conductive layer over the plurality of plug ion-implantation regions to form a plurality of contact plugs, wherein the buffer layer is configured to enable a higher implantation energy to be used to implant the second dopants to the given depth, so that a concentration profile of the second dopants has a reduced slope.

2. The method as recited in claim 1, wherein the second dopants are implanted to form the plug ion-implantation region by employing a blanket ion-implantation technique without using a mask, wherein the plug ion-implantation regions are formed by implanting the second dopants using at least two different energy levels, so that the concentration profile of the second dopants has a reduced slope to suppress a width of a depletion layer from being decreased, the depletion layer being providing between the well and the cell junctions, wherein the well is formed before the cell junctions and plug ion-implantation regions.

3. The method as recited in claim 2, wherein the blanket ion-implantation process proceeds by employing phosphorus $^{31}P$ with a dose ranging from about $1\times10^{12}$ ions/cm$^2$ to about $3\times10^{13}$ ions/cm$^2$ and an implantation energy ranging from about 80 keV to about 150 keV, wherein a dosage used for the blanket ion implantation process is higher than a resulting dosage of the plug ion-implantation regions to compensate for loss of the second dopants in the buffer layer.

4. The method as recited in claim 2, wherein the blanket ion-implantation process proceeds by employing $^{31}P$ with distributed energy within a range from about 80 keV to about 150 keV and dose within a range from about $1\times10^{12}$ ions/cm$^2$ to about $3\times10^{13}$ ions/cm$^2$ both being applied in several sets.

5. The method as recited in claim 4, wherein the blanket ion-implantation process with distributed energy is carried out in several sets by increasing energy from a high level to a low level but within a range from about 80 keV to about 150 keV.

6. The method as recited in claim 1, wherein the buffer layer is a nitride layer, wherein the plug ion-implantation regions are formed by implanting the second dopants using at least two different energy levels, so that a concentration profile of the second dopants has a reduced slope.

7. The method as recited in claim 6, wherein the nitride layer has a thickness of no more than about 500 Å.

8. The method as recited in claim 1, wherein the first dopant and the second dopant are N-type dopants.

9. The method as recited in claim 1, further comprising:
forming a spacer at both sidewalls of each gate line by etching the buffer layer;
forming an inter-layer insulation layer on a resultant substrate structure;

forming a plurality of contact holes exposing a surface of each cell junction by etching the inter-layer insulation layer; and forming a plurality of contact plugs electrically coupled to the cell junctions th rough the contact holes.

10. A method for forming contact plugs on a semiconductor device, the method comprising:

forming a well of a second conductivity type within a substrate;

forming a plurality of gate structures on the substrate, the gate structures defining a plurality of regions;

implanting first dopants of a first conductivity type into the regions defined by the gate structures using the gate structures as a mask to form a plurality of cell junctions, so that each gate structure is provided between two cell junctions;

forming a buffer layer over the regions defined by the gate structures, the buffer layer having a thickness of more than 200 Å; and implanting second dopants of the first conductivity type through the buffer layer and into the regions defined by the gate structures using a first energy level to form a plurality of plug ion-implantation regions of a given depth, the plug ion-implantation regions being configured to receive the contact plugs; and, implanting the second dopants of the first conductivity type through the buffer layer and into the regions defined by the gate structures using a second energy level that is different from the first energy level to form the plug ion-implantation regions.

wherein the cell junctions and the plug ion-implantation regions are defined with in the well.

11. The method of claim 10, wherein the buffer layer is configured to enable a higher implantation energy to be used to implant the second dopants to the given depth, so that a concentration profile of the second dopants has a reduced slope, wherein the second dopants are implanted into the substrate via the buffer layer to obtain a concentration profile of the second dopants in the substrate that has a reduced slope, and wherein the reduced slope of the concentration profile of the second dopants suppresses a width of a depletion layer from being decreased, the depletion layer being provided between the well and the cell junction, and wherein the plug ion-implantation regions are formed using at least two different energy levels to provide the concentration profile of the second dopants in the substrate with a reduced slope.

12. A method for forming contact plugs on a semiconductor device, the method comprising:

forming a well of a second conductivity type within a substrate;

forming a plurality of gate structures on the substrate, the gate structures defining a plurality of regions;

implanting first dopants of a first conductivity type into the regions defined by the gate structures using the gate structures as a mask to form a plurality of cell junctions, so that each gate structure is provided between two cell junctions;

forming a buffer layer over the regions defined by the gate structures;

implanting second dopants of the first conductivity type through the buffer layer and into the regions defined by the gate structures to form a plurality of plug ion-implantation regions of a given depth, the second dopants are implanted using at least two different energy levels the plug ion-implantation regions being configured to receive the contact plugs; and forming contact plugs on the plug ion-implantation regions, the contact plugs having substantially planar upper surfaces, wherein the cell junctions and the plug ion-implantation regions are defined within the well, and wherein the buffer layer is configured to enable a higher implantation energy to be used to implant the second dopants to the given depth, so that a concentration profile of the second dopants has a reduced slope.

13. The method of claim 12, wherein a dosage used for the implantation of the second dopants is higher than a resulting dosage of the plug ion-implantation regions to compensate for loss of the second dopants in the buffer layer.

14. The method of claim 12, wherein the buffer layer has a thickness of more than 200 Å.

* * * * *